United States Patent
Zhu et al.

(10) Patent No.: US 9,263,581 B2
(45) Date of Patent: Feb. 16, 2016

(54) SEMICONDUCTOR STRUCTURE AND METHOD FOR MANUFACTURING THE SAME

(75) Inventors: Huilong Zhu, Poughkeepsie, NY (US); Haizhou Yin, Poughkeepsie, NY (US); Zhijiong Luo, Poughkeepsie, NY (US); Qingqing Liang, Lagrangeville, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/394,802

(22) PCT Filed: May 30, 2012

(86) PCT No.: PCT/CN2012/076260
§ 371 (c)(1),
(2), (4) Date: Oct. 16, 2014

(87) PCT Pub. No.: WO2013/155760
PCT Pub. Date: Oct. 24, 2013

(65) Prior Publication Data
US 2015/0076602 A1    Mar. 19, 2015

(30) Foreign Application Priority Data
Apr. 19, 2012 (CN) .......................... 2012 1 0117019

(51) Int. Cl.
*H01L 23/62* (2006.01)
*H01L 29/78* (2006.01)
(Continued)

(52) U.S. Cl.
CPC .......... *H01L 29/7849* (2013.01); *H01L 21/265* (2013.01); *H01L 21/26506* (2013.01); *H01L 21/324* (2013.01); *H01L 29/0649* (2013.01);
(Continued)

(58) Field of Classification Search
CPC ................. H01L 2924/00; H01L 2224/32225; H01L 2224/48227; H01L 2224/73265; H01L 2224/73204; H01L 2224/32145; H01L 2224/16225; H01L 2924/15311; H01L 21/26506; H01L 29/785; H01L 2224/16145; H01L 2924/01
See application file for complete search history.

(56) References Cited

U.S. PATENT DOCUMENTS 6,887,751 B2    5/2005   Chidambarrao et al.
2005/0093075 A1*  5/2005   Bentum et al. ................. 257/368
(Continued)

FOREIGN PATENT DOCUMENTS

CN    1914722 A    2/2007
CN    102356456 A   2/2012

*Primary Examiner* — Robert Bachner
(74) *Attorney, Agent, or Firm* — Enshan Hong; VLP Law Group LLP

(57) ABSTRACT

A method for manufacturing a semiconductor structure comprises the following steps: providing an SOI substrate and forming a gate structure on the SOI substrate; implanting ions to induce stress in the semiconductor structure by using the gate structure as mask to form a stress-inducing region, which is located under the BOX layer on the SOI substrate on both sides of the gate structure. A semiconductor structure manufactured according to the above method is also disclosed. The semiconductor structure and the method for manufacturing the same disclosed in the present application form on the ground layer a stress-inducing region, which provides favorable stress to the semiconductor device channel and contributes to the improvement of the semiconductor device performance.

6 Claims, 4 Drawing Sheets

(51) Int. Cl.
 *H01L 29/66* (2006.01)
 *H01L 29/786* (2006.01)
 *H01L 21/265* (2006.01)
 *H01L 21/324* (2006.01)
 *H01L 29/06* (2006.01)

(52) U.S. Cl.
 CPC .... *H01L 29/66583* (2013.01); *H01L 29/66772* (2013.01); *H01L 29/78654* (2013.01); *H01L 21/2652* (2013.01); *H01L 29/66545* (2013.01)

(56) References Cited

U.S. PATENT DOCUMENTS

| | | | |
|---|---|---|---|
| 2005/0227498 A1* | 10/2005 | Furukawa et al. | 438/758 |
| 2006/0189096 A1 | 8/2006 | Doyle et al. | |
| 2007/0128820 A1* | 6/2007 | Majumdar et al. | 438/369 |
| 2009/0159972 A1* | 6/2009 | Jakschik et al. | 257/350 |

* cited by examiner

SEMICONDUCTOR STRUCTURE AND METHOD FOR MANUFACTURING THE SAME

CROSS REFERENCE TO RELATED APPLICATIONS

This is a U.S. national stage of international patent application No. PCT/CN2012/076260, filed on May 30, 2012. Priority is claimed on the following application: Country: China, Application No.: 201210117019.5, Filed: Apr. 19, 2012, the content of which is incorporated here by reference.

TECHNICAL FIELD

The present disclosure relates to the field of semiconductor technology, and in particular, to a semiconductor structure and a method for manufacturing the same.

BACKGROUND

With the development of semiconductor device manufacturing technology, integrated circuit with higher performance and more functionality requires higher device density and further decrease in the size and space of or between the components and units. Therefore, process control is highly required in semiconductor device manufacturing process.

The operation speed of semiconductor devices can be promoted by scaling down and the channel length of the MOS transistor is also continuously scaled down. However, as the channel length of the MOS transistor becomes very short, the so-called short channel effect (SCE) and the drain-induced barrier lowering (DIBL) set a serious obstacle to the miniaturization of semiconductor devices.

Because device performance may decrease due to SCE and may not work properly, it is an important objective in semiconductor device manufacturing research to reduce the SCE. The internal mechanical stress in semiconductor device is widely used in adjusting device performance and the SCE can be effectively reduced by applying stress to the channel.

The commonly used method for increasing stress is to operate in the S/D region to form tensile or compressive stress in the channel. For example, in common silicon technology, the transistor channel is aligned along the silicon {110} orientation. In this arrangement, when compressive stress along the channel direction and/or tensile stress perpendicular to the channel direction is applied to the channel, the hole mobility will be increased; and when tensile stress along the channel direction and/or compressive stress perpendicular to the channel direction is applied to the channel, the electron mobility will be increased. Therefore, the device performance can be improved by applying stress to the channel region of the semiconductor devices.

Using silicon on insulator (SOI) substrate in replace of the silicon substrate can also achieve the effect of reducing SCE and improving device performance. The SOI technology is to introduce a buried oxygen layer between the top bulk silicon layer and the substrate the bulk silicon layer. By forming a semiconductor thin film on the insulator, the SOI material possesses the following incomparable advantages over bulk silicon: the dielectric isolation of the integrated circuit components can be realized and the parasitic latch effect in the bulk silicon CMOS circuit can be completely eliminated. The integrated circuit using the SOI material possesses advantages such as small parasitic capacitance, high integration density, fast speed, simple processability, small SCE and especially suitable for low-voltage low-power circuit. Therefore, SOI might become the mainstream technology in the deep sub-micron low-voltage, low-power integrated circuits in the future.

Meanwhile, the SOI heterostructure induces opportunities for making ultrathin silicon bulk devices. The ultrathin SOI provides an optional method for controlling the SCE by establishing a natural electrostatic barrier in the silicon dielectric interface.

In currently used technologies, a ground layer is formed under the ultrathin BOX layer in the ultrathin-SOI MOSFET to reduce the SCE and control the power consumption. However, it is very difficult to apply strong stress in the semiconductor device with this structure, and performance improvement in this device is limited.

SUMMARY OF THE DISCLOSURE

The purpose of the present disclosure is to provide a semiconductor structure and a method for manufacturing the same. By forming a stress-inducing region on the ground layer, favorable stress to the channel region of the semiconductor device manufactured using ultrathin SOI substrate is applied to improve the semiconductor device performance.

According to one aspect of the present disclosure, a method for manufacturing a semiconductor structure is provided, comprising:

(a) providing an SOI substrate and forming a gate structure on the SOI substrate;

(b) implanting ions to induce stress in the semiconductor structure by using the gate structure as mask to form a stress-inducing region, which is located under the BOX layer on the SOI substrate on both sides of the gate structure.

According to another aspect of the present disclosure, a semiconductor structure is also provided, comprising:

an SOI substrate, comprising an SOI layer, a BOX layer, and a bulk silicon layer;

an S/D region formed in the SOI layer and a stress-inducing region in the bulk silicon layer under the S/D region.

The semiconductor structure and the method for manufacturing the same disclosed in the present application form a ground layer on the ultrathin SOI substrate, and subsequently form a stress-inducing region by ion implantation and annealing process in the ground layer. The stress-inducing region provides favorable stress to the semiconductor device channel and contributes to the improvement of the semiconductor device performance.

BRIEF DESCRIPTION OF THE DRAWINGS

Other characteristics, objectives and advantages will become more obvious after reading the detailed description of the non-limiting embodiments with reference to the following attached drawings, in which.

In the attached drawings, the same or similar reference numbers represent the same or similar components.

DETAILED DESCRIPTION

In order to elucidate the purpose, technical solutions and advantages of the present disclosure, exemplary embodiments of the present disclosure will be described in more details below in combination with the attached drawings.

Exemplary embodiments of the present disclosure will be described in more details below. Some embodiments are illustrated in the attached drawings, in which the same or similar reference numbers represent the same or similar elements or the components having the same or similar functions. The following embodiments described with reference to the drawings are only exemplary for explaining the present invention, and therefore shall not be construed as limiting the present invention.

The disclosure below provides many different embodiments or examples to implement different structures of the present invention. In order to simplify the disclosure of the present invention, components and settings of specific examples are described below. Obviously, they are merely exemplary, and are not intended to limit the present invention. In addition, reference numbers and/or letters can be repeated in different examples of the invention. This repetition is used only for simplicity and clarity, and does not indicate any relationship between the discussed embodiments and/or settings. In addition, the invention provides a variety of specific examples of processes and materials, but it is obvious for a person of ordinary skill in the art that other processes can be applied and/or other materials can be used. In addition, the following description of a structure where a first feature is "on" a second feature can comprise examples where the first and second feature are in direct contact, and also can comprise examples where additional features are formed between the first and second features so that the first and second features may not be in direct contact. Note that the components in the attached drawings may not be drawn to scale. The description of the known components and processing technology is omitted in the present disclosure to avoid unnecessary limitation to the present disclosure.

As the semiconductor structures provided in the present disclosure possesses several preferred structures, one of the preferred structures is provided and described below.

Figure 9:
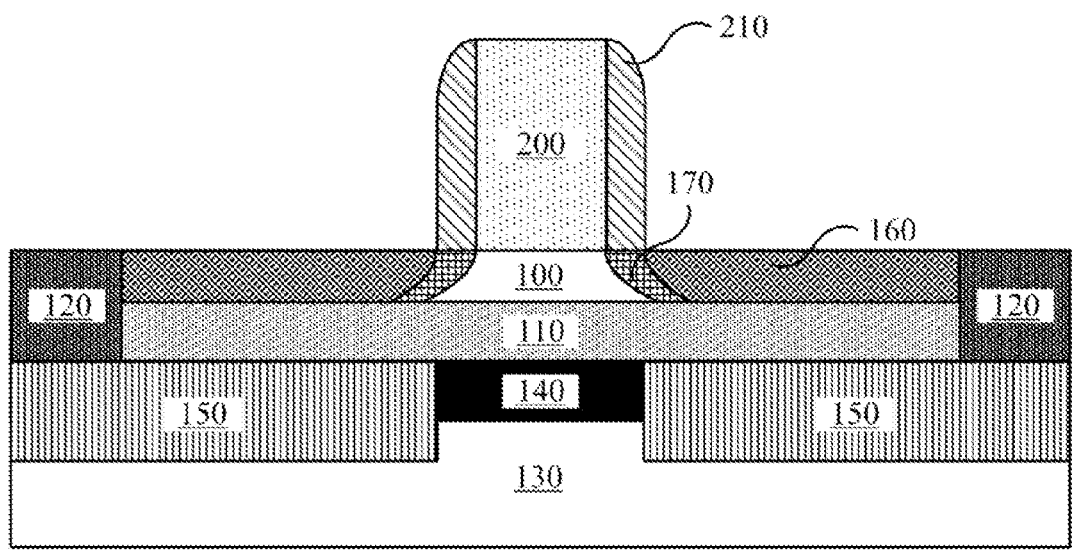

Exemplary Embodiments 1:

FIG. 9 shows a semiconductor structure, comprising an SOI substrate, a ground layer 140, a gate structure 200, an S/D region 160, an S/D extension region 170, and a stress-inducing region 150, wherein:

the SOI substrate comprises an SOI layer 100, a BOX layer 110, and a bulk silicon layer 130; the gate structure 200 is formed on the SOI layer 100;

the SID region 160 and the SID extension region 170 are formed in the SOI layer 100;

The ground layer 140 is located in the bulk silicon layer 130 under the BOX layer 110;

The stress-inducing region 150 is formed under the BOX layer 110 in the SOI substrate on both sides of the gate structure 200.

In addition, a sidewall spacer 210 is formed on both sides of the gate structure 200.

The SOI substrate possesses at least three layers of structures, comprising a bulk silicon layer 130, a BOX layer 110 above the bulk silicon layer 130, and an SOI layer 100 covered above the BOX layer 110, wherein the materials for the BOX layer 110 can be crystal or non-crystalline oxides, nitrides, or the combinations thereof, preferably, SiO2 as commonly used. The materials for the SOI layer 100 can be monocrystalline silicon, germanium, or compounds in Group III-V (for example, silicon carbide, gallium arsenide, indium arsenide or indium phosphide, etc.) The SOI substrate chosen in the present disclosure is the SOI substrate with an ultrathin SOI layer 100 and an ultrathin BOX layer 110, wherein the depth of the ultrathin SOI layer 100 is in the range of 5-20 nm, such as 5 nm, 15 nm, or 20 nm; the depth of the ultrathin BOX layer 110 is in the range of 5-30 nm such as 5 nm, 20 nm, or 30 nm Optionally, an isolation region 120 can be formed in the SOI substrate to divide the SOI layer 100 into independent regions to form transistor structure in the subsequent process. The materials for the isolation region 120 are insulation materials, such as SiO2, Si3N4, or the combination thereof. The width of the isolation region 120 can be determined by the design of the semiconductor structure.

In the front gate process, the gate structure 200 comprises a gate dielectric layer and a gate stack; in the gate last process, the gate structure 200 can comprise a dummy gate and a gate dielectric layer to support the dummy gate or an replacement gate stack formed after removing the dummy gate. The sidewall spacer 210 can be formed with materials such as silicon nitride, silicon oxide, silicon oxynitride, silicon carbide, and/or other suitable materials. The sidewall spacer 210 can possess multi-layer structure and can be formed by decomposition-etch process with a depth in range of 10-100 nm.

An S/D region 160 and an S/D extension region 170 are formed by ion implantation in the SOI layer 100. For example, the S/D region 160 and the S/D extension region 170 can be p-type doping for PMOS, and the S/D region 160 and the S/D extension region 170 can be n-type doping for NMOS.

A ground layer 140 is formed in the bulk silicon layer 130, for example, n-type and p-type doping, or p-type and n-type doping can be used for PFET and NFET, respectively. A stress-inducing region 150 is formed in the ground layer 140 by carbon doping. The position of the stress-inducing region 150 is located under the S/D region 160 (with an interval of the BOX layer). The NFET performance can be improved by applying stress to the channel region to increase the electron mobility.

The above exemplary embodiments will be described in more details below in combination with the manufacturing method of the semiconductor structure provided in the present disclosure.

Figure 1:
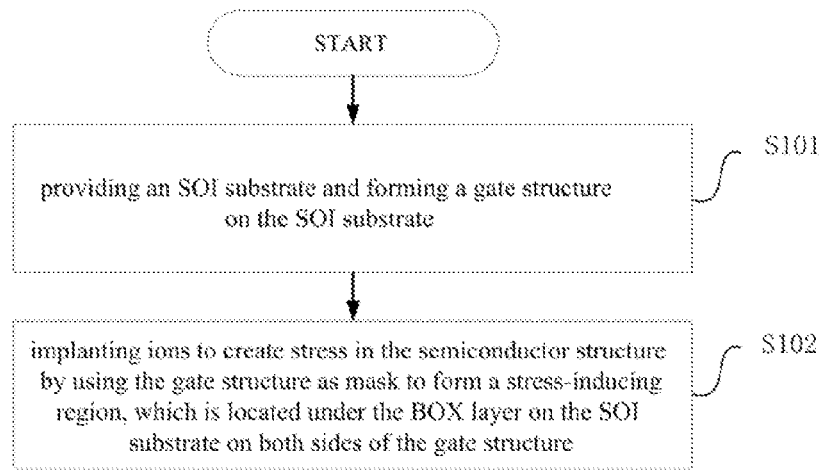
FIG. 1 is a schematic flow chart showing the method for manufacturing a semiconductor structure according to an embodiment of the present disclosure.

Please refer to FIG. 1, which is the schematic flow chart showing the method for manufacturing a semiconductor structure according to an exemplary embodiment of the present disclosure, comprising:

Step S101, providing an SOI substrate and forming a gate structure 200 on the SOI substrate;

Step S102, implanting ions to induce stress in the semiconductor structure by using the gate structure 200 as mask to form a stress-inducing region 150, which is located under the BOX layer 110 on the SOI substrate on both sides of the gate structure.

Step S101 to S102 will be illustrated below in combination with FIGS. 2-9, which are schematic cross-sectional views of the various stages for manufacturing the semiconductor structure according to the flow chart in FIG. 1. Note that the attached drawings in each embodiment are only for illustration purpose, so are not drawn to scale.

Step S101 is executed referring to FIGS. 2-8. An SOI substrate is provided and a gate structure 200 is formed on the SOI substrate.

Figure 2:
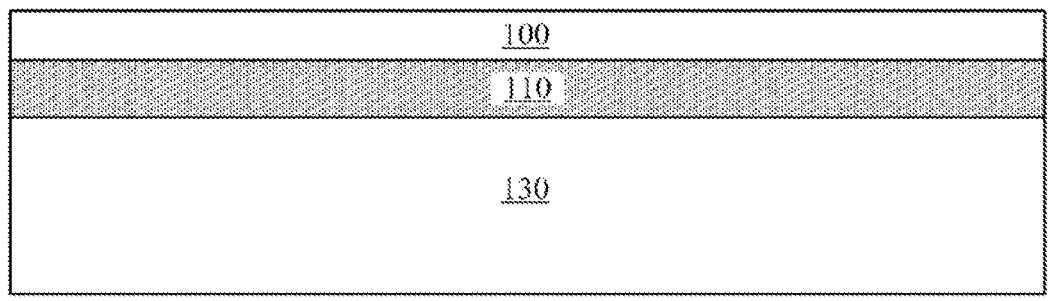
FIGS. 2-9 are schematic cross-sectional views of the various stages for manufacturing the semiconductor structure according to the flow chart in FIG. 1.

First refer to FIG. 2, wherein the SOI substrate possesses at least three layers of structures, comprising a bulk silicon layer 130, a BOX layer 110 above the bulk silicon layer 130, and an SOI layer 100 covered above the BOX layer 110. The commonly used material for the BOX layer 110 is SiO2. The materials for the SOI layer 100 can be monocrystalline silicon, germanium, or compounds in Group III-V (for example, silicon carbide, gallium arsenide, indium arsenide or indium phosphide, etc.) The SOI substrate chosen in the present disclosure is the SOI substrate with an ultrathin SOI layer 100 and an ultrathin BOX layer 110, wherein the depth of the ultrathin SOI layer 100 is in the range of 5-20 nm, such as 5 nm, 15 nm, or 20 nm; the depth of the ultrathin BOX layer 110 is in the range of 5-30 nm, such as 5 nm, 20 nm, or 30 nm.

Figure 3:
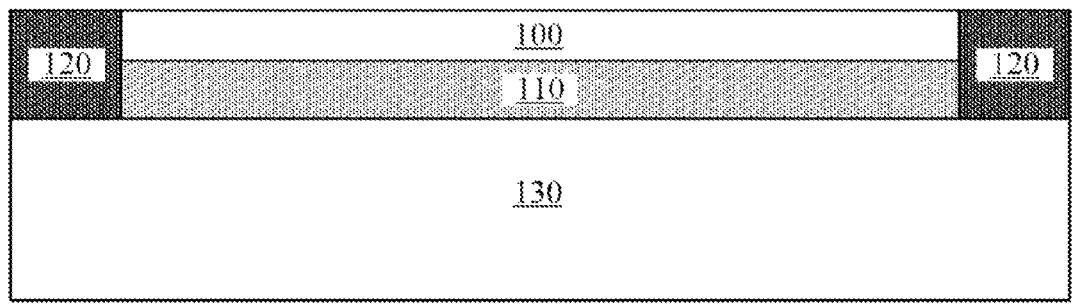

Then an isolation region 120 is formed in the SOI substrate to divide the SOI layer 100 into individual regions to form transistor structure in the subsequent process, as shown in FIG. 3. The materials for the isolation region 120 are insulation materials, such as SiO2, Si3N4, or the combinations thereof. The width of the isolation region 120 can be determined by the design of the semiconductor structure.

Figure 4:
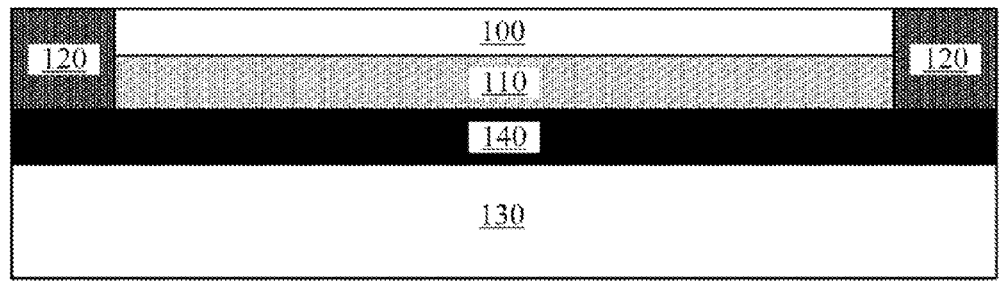

A ground layer 140 is formed by ion implantation after the isolation region 120 is formed, as referred to FIG. 4. By controlling the implantation energy the ground layer can be formed under the BOX layer 110. For example, n-type and p-type doping can be used in PFET and NFET, respectively, or in other embodiments, p-type and n-type doping can be used respectively.

Figure 5:
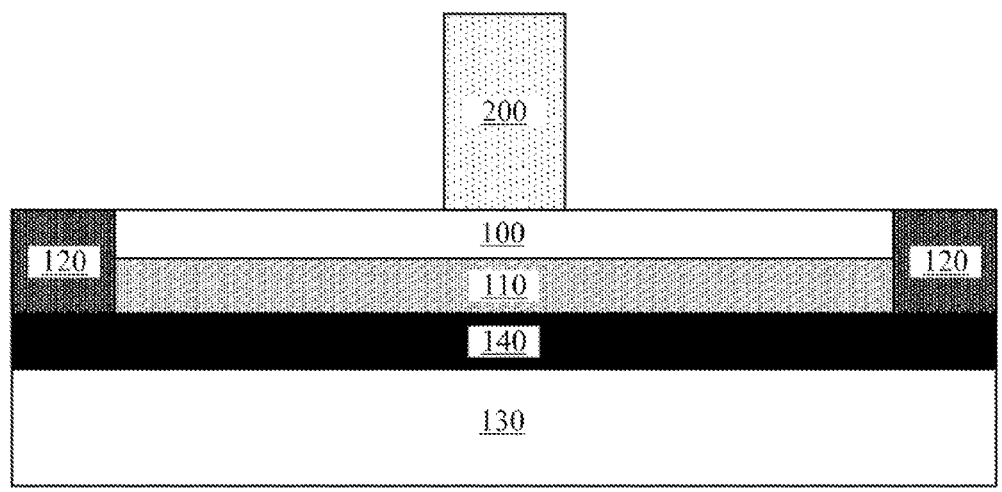

Next a gate structure 200 is formed on the SOI substrate (in particular on the SOI layer 100), as referred to FIG. 5. In the front gate process, the gate structure 200 is formed in a process such as forming the gate dielectric layer covered the SOI layer 100, the gate metal layer covered the gate dielectric layer, the gate electrode layer covered the gate metal layer, the oxide layer covered the gate electrode layer, the nitride layer covered the oxide layer, and the photoresist layer covered the nitride layer and to which the gate stack can be drawn and etched. The materials for the gate dielectric layer can be a thermal oxide layer comprising silicon oxide or silicon oxynitride, or high K dielectric such as HfO2, HfSiO, HfSiON, HMO, HfTiO, HfZrO, Al2O3, La2O3, ZrO2, LaAlO, or one or any of the combinations thereof, with a depth of 1-4 nm; the materials for gate metal layer can be TaC, TiN, TaTbN, TaErN, TaYbN, TaSiN, HfSiN, MoSiN, RuTax, NiTa or one or any of the combinations thereof, with a depth of 5-20 nm; the material for the gate electrode layer can be Poly-Si, with a depth of 20-80 nm; the material for the oxide layer is SiO2, with a depth of 5-10 nm; the material for the nitride layer is Si3N4, with a depth of 10-50 nm; and the materials for photoresist layer can be vinyl monomer material, materials containing azide compound, or polyethylene lauric acid ester materials. Except for the photoresist layer, the above multi-layer structure can be formed successively on the SOI layer 100 by chemical vapor deposition (CVD), high density plasmon CVD or atomic layer deposition (ALD), plasma enhanced ALD (PEALD), pulsed laser deposition (PLD), or other suitable methods. The gate structure 200 can be formed by etching the above multi-layer structure after composition of the photoresist layer (the gate lines are formed on the SOI substrate).

In the gate last process, the gate structure 200 comprises a dummy gate and a gate dielectric layer to support the dummy gate. An replacement gate stack can be formed in the subsequent steps and the gate stack structure can be formed by removing the dummy gate.

After the gate structure 200 is formed, annealing to control the doping distribution of the ground layer 140 is performed to adjust the turn-on voltage of the device.

Figure 6:
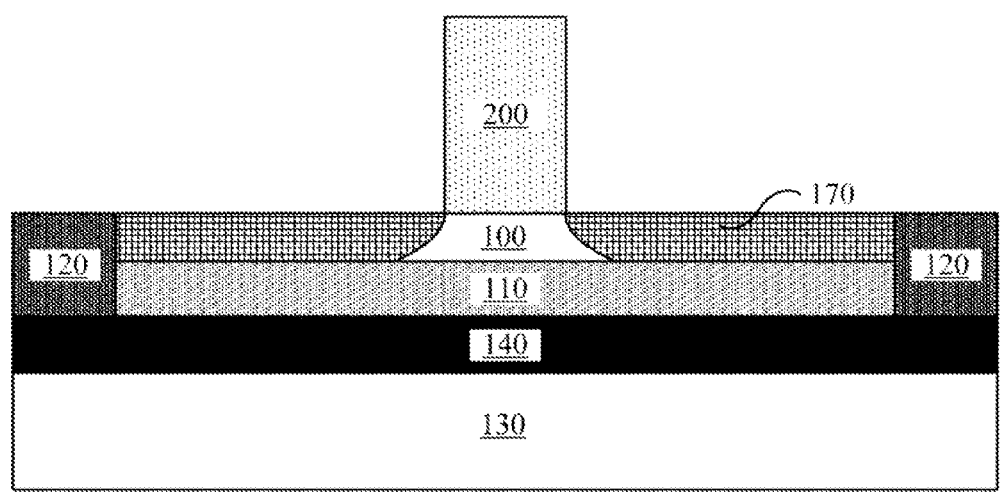

After the annealing process, an S/D extension region 170 is formed in the SOI layer 100 by low energy implantation, as referred to FIG. 6. P-type or N-type dopants or impurities can be implanted into the SOI layer 100. N-type dopants are doped into the SOI layer 100 if the manufactured semiconductor device is NMOS, such as boron or indium. P-type dopants are doped into the SOI layer 100 if the manufactured semiconductor device is PMOS, such as arsenic or phosphorus. Then the semiconductor structure is annealed to activate the dopants in the S/D extension region 170. In one embodiment, the S/D extension region 170 may not be formed.

Figure 7:
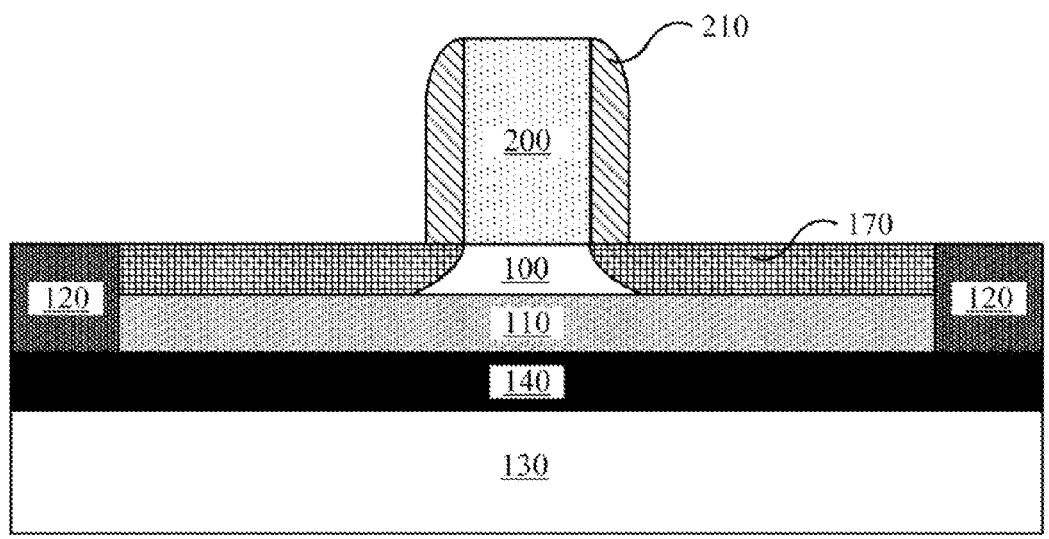

Subsequently, a sidewall spacer 210 is formed on the sidewall of the gate structure 200 to separate the gate structure 200, as referred to FIG. 7. The sidewall spacer 210 can be formed with materials such as silicon nitride, silicon oxide, silicon oxynitride, silicon carbide, and/or other suitable materials. The sidewall spacer 210 can possess multi-layer structure and can be formed by decomposition-etch process with a depth in range of 10-100 nm, such as 30 nm, 50 nm, or 80 nm.

Figure 8:
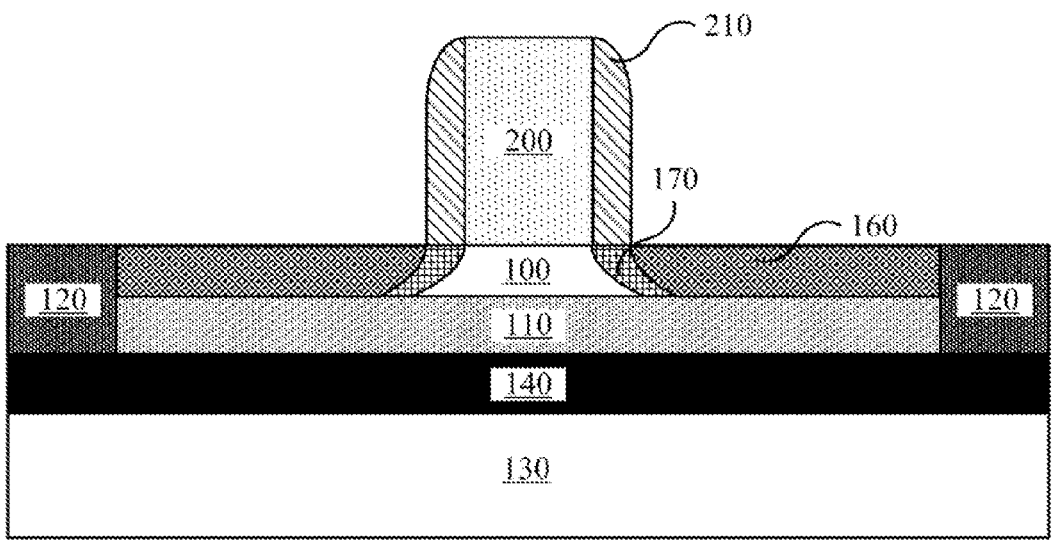

An S/D region 160 is formed after the sidewall 210 is formed. As shown in FIG. 8, the S/D region 160 can be formed by implantation of the P-type or N-type dopant or impurities into the SOI layer 100. For example, the S/D region 160 can be P-type doped for PMOS and N-type doped for NMOS. The S/D region 160 can be formed by lithography, ion implantation, diffusion, and/or other suitable process methods. In this embodiment, the S/D region 160 is formed inside the SOI layer 100, and in some other embodiments, the S/D region 160 can be formed by selective epitaxial growth to enhance the S/D structure, wherein the top of the epitaxial part is higher than the bottom of the gate stack (the bottom of the gate stack in this specification means the interface between the gate stack and the SOI layer 100).

Step S102 is executed by implanting ions to induce stress in the semiconductor structure by using the gate structure 200 as mask to form a stress-inducing region 150, which is located under the BOX layer 110 on the SOI substrate on both sides of the gate structure.

As referred to FIG. 9, the stress-inducing region 150 is formed. First, carbon implantation is conducted to the ground layer by using the gate structure 200 as a mask and the stress-inducing region 150 is formed by conventional carbon ion implantation process to control the depth to reach the bottom of the BOX layer. Then high temperature annealing to repair the damage caused by implantation is conducted, such as by laser annealing, flash annealing, etc. In one embodiment, spike annealing process can be used to anneal the semiconductor structure, such as using laser annealing at a temperature above 1200° C.

As shown in the figures, the stress-inducing region 150 is formed in the bulk silicon 130 under the BOX layer on both sides of the gate structure. The formation of the stress-inducing region 150 can apply tensile stress to the channel to improve the performance of n-type semiconductor devices.

In the gate last process, the dummy gate can be removed at this time and the replacement gate stack structure can be formed.

The semiconductor structure and the method for manufacturing the same disclosed in the present application form on the ground layer a stress-inducing region, which provides favorable stress to the semiconductor device channel and improve the charge carrier mobility in the n-type MOSFET in addition to reduce the short channel effect.

Although the exemplified embodiments and the advantages thereof have been illustrated in detail, it is understood that any modification, replacement and change can be made to these embodiments without departing from the spirit of the invention and the scope defined in the attaching claims. As to other examples, a skilled technician in the art can easily understand that the order of the process steps can be modified without falling outside the protection scope of the invention.

In addition, the application fields of the invention is limited to the process, mechanism, fabrication, material compositions, means, methods and/or steps in the particular embodiments as given in the description. From the disclosure of the invention, a skilled technician in the art can easily understand that, as for the process, mechanism, fabrication, material compositions, means, methods and/or steps at present or to be developed, which are carried out to realize substantially the same function or obtain substantially the same effects as the corresponding examples described according to the invention do, such process, mechanism, fabrication, material compositions, means, methods and/or steps can be applied according to the invention. Therefore, the claims attached to the invention are intended to encompass the process, mechanism, fabrication, material compositions, means, methods and/or steps into the protection scope thereof.

We claim:

1. A semiconductor structure, comprising:
    a silicon on insulator (SOI) substrate, comprising an SOI layer, a buried oxygen (BOX) layer, and a bulk silicon layer;
    a gate structure formed on the SOI layer;
    a source/drain(S/D) region formed in the SOI layer on both sides of the gate structure; and
    a stress-inducing region in the bulk silicon layer under the S/D region,
    wherein the stress-inducing region comprises carbon ions and is only formed in the bulk silicon layer under the BOX layer on both sides of the gate structure by a carbon ion implantation process.

2. The semiconductor structure according to claim 1, wherein the depth of the SOI layer in the SOI substrate is in the range of 5-20 nm.

3. The semiconductor structure according to claim 1, wherein the depth of the BOX layer is in the range of 5-30 nm.

4. The semiconductor structure according to claim 1, also comprising an S/D extension region, which is located in the SOI layer on both sides of the gate structure.

5. The semiconductor structure according to claim 1, also comprising a ground layer, which is located in the bulk silicon layer under the BOX layer.

6. The semiconductor structure according to claim 5, wherein the semiconductor structure is NMOSFET and the ground layer is n-type or p-type doping.

* * * * *